United States Patent [19]

Dössel et al.

[11] Patent Number: 5,644,229
[45] Date of Patent: Jul. 1, 1997

[54] METHOD OF DETERMINING THE SPATIAL FIELD DISTRIBUTION

[75] Inventors: Olaf Dössel, Tangstedt; Hans-Aloys Wischmann, Hamburg; Manfred Fuchs, Uetersen, all of Germany; Rob Steenbrink, Roermond; Robert Oostenveld, Groningen, both of Netherlands

[73] Assignee: U.S. Philips Corporation, New York, N.Y.

[21] Appl. No.: 553,230

[22] Filed: Nov. 7, 1995

[30] Foreign Application Priority Data

Nov. 7, 1994 [DE] Germany ............... 44 39 691.0

[51] Int. Cl.$^6$ .................... G01R 33/022; A61B 5/04
[52] U.S. Cl. ............ 324/247; 324/244; 128/653.1; 364/571.02
[58] Field of Search ................ 324/244, 247, 324/248, 260, 225; 128/653.1, 731, 734, 696, 700; 364/413.02, 413.26, 413.03, 413.06, 571.01–571.06

[56] References Cited

U.S. PATENT DOCUMENTS

| | | | |
|---|---|---|---|
| 4,974,602 | 12/1990 | Abraham-fuchs et al. | 128/731 |
| 5,136,242 | 8/1992 | Abraham-fuchs | 324/244 |
| 5,417,211 | 5/1995 | Abraham-fuchs et al. | 128/653.1 |

FOREIGN PATENT DOCUMENTS 4304516  9/1993  Germany .

Primary Examiner—Sandra L. O'Shea
Assistant Examiner—Jay M. Patidar
Attorney, Agent, or Firm—Jack D. Slobod

[57] ABSTRACT

The invention relates to a method of determining the spatial field distribution and/or the spatial position of a useful field source, producing said field distribution, by means of a multichannel field measuring device which comprises a plurality of spatially distributed sensors which produce measured values which contain on the one hand useful measured values stemming from the useful field source and on the other hand noise measured values stemming from at least one noise field source, correction values being formed and superposed on the measured values so that compensated measured values are obtained which are compared with similarly compensated, mathematically derived reference values which are produced by a fictitious reference field source by means of the field sensors, the reference field source being determined for which the pattern of compensated reference values corresponds best to the pattern of compensated measured values.

20 Claims, 2 Drawing Sheets

METHOD OF DETERMINING THE SPATIAL FIELD DISTRIBUTION

BACKGROUND OF THE INVENTION

The invention relates to a method of determining the spatial field distribution and/or the spatial position of a useful field source, producing the field distribution by means of a multi-channel field measuring device which comprises a plurality of spatially distributed sensors which generate measured values which contain on the one hand useful measured values stemming from the useful field source and on the other hand noise-measured values stemming from at least one noise field source, correction values being formed and superposed on the measured values so that compensated measured values are obtained which are compared with similarly compensated, mathematically derived reference values which are produced by a fictitious reference field source by means of the field sensors, the method thus determining the reference field source for which the pattern of compensated reference values corresponds best to the pattern of compensated measured values.

Using suitable known sensors, such a method enables the measurement of electrical or magnetic field distributions or the localization of associated field sources. For example, magnetoresistive elements constitute suitable magnetic sensors. Sensors utilizing the rotation of the magnetization in ferromagnetic films are also highly sensitive. SQUIDs are the sensors customarily used for measurements in the medical field.

The method of the invention is preferably used for the measurement of biomagnetic fields which are produced by currents flowing in the body, notably in the head or the heart.

A method of the kind set forth is known from DE-A-43 04 516.

Because on the useful fields to be measured there are usually superposed much stronger noise fields from noise field sources which are remote in comparison with the useful field source to be examined, the measured values contain comparatively large noise-measured values in addition to the desired useful measured values. Therefore, steps must be taken so as to suppress the noise measured values. In the known method noise signal vectors are derived from a pattern of measured values determined during a given period of time, said noise signal vectors being used to correct the measured values. It is assumed that the noise signal only slightly, resembles the useful signal. The comparison of the measured values with calculated field values is based on a corrected measured signal vector and a corrected source signal vector.

If the use of complex, heavy and expensive shielding devices is to be avoided, the steps taken for noise field compensation must be particularly effective. This holds notably if gradiometer devices are not or cannot be used for medical SQUID measurements, as is the case for example for SQUIDs ceramic high-temperature superconductors. This is because the manufacture of the superconducting connections required for conventional gradiometer devices is problematic.

SUMMARY OF THE INVENTION

It is an object of the invention to provide a method of the kind set forth whereby the effect of noise fields can be substantially eliminated and whereby not only a spatially uniform noise field is to be detected.

This object is achieved in that the pattern of measured values is approximated by a correction function which contains a number of terms of a function series which are essential to the spatial variation of the noise-measured values, in the correction function there being absent at least one term of the function series which is essential to the spatial variation of the useful measured values but not essential to the spatial variation of the noise measured values, that compensated measured values are formed as the difference between the measured values and the transformed measured values occuring at the areas of the associated field sensors, on the basis of the correction function and that the reference values are transformed into compensated reference values in the same way.

The method in accordance with the invention enables noise field suppression factors of the order of magnitude of $10^5$ to be achieved. The noise field suppression can be performed at any instant, independently of the temporal variation of the noise signals.

Converging mathematical function series are suitable for the approximation of the measured pattern of measured values by a correction function.

Particularly suitable are power series, but in special cases other function series may also be attractive, depending on the spatial arrangement of the sensors and also on the characteristic of the noise fields, for example Tschebyscheff polynomials, trigonometric functions or spherical functions, which are particularly suitable for helm systems for measurement of cerebral fields.

The number of sensors used to form the correction function should be at least "1" larger than the total number of function coefficients to be determined. A redundant set of equations is then obtained and correction function coefficients offering optimum adaptation of the measured values are determined (linear least squares fit). The larger the number of measured values taken into account from different sensors, the less the intrinsic sensor noise will affect the result.

Evidently, the spatial position of the sensors taken into account should be such that they are capable of supplying linearly independent information for the mathematical determination of the function coefficients. With a view to achieving a high accuracy, the information should be significantly independent. This means in practice that the sensors used should be distributed as uniformly as possible across the space available for the measuring device and should be situated as far as possible from one another. If field components or field vectors pointing in a plurality of coordinate directions are to be determined, a corresponding number of sensors must be assigned to each coordinate direction.

In a simple version of the method in accordance with the invention the field sensors are arranged in a single measuring plane so that field components extending perpendicularly to the measuring plane are determined.

Further field components can be measured by means of additional field sensors which are arranged in measuring planes which are inclined preferably orthogonal to the first measuring plane.

Because field sensors cannnot be arranged in a measuring plane with absolute precision due manufacturing tolerances, field components from directions orthogonal to the desired measuring direction could also be detected in the case of angular deviations. Correction is then possible in that with the field sensors arranged in a measuring plane there are associated correction sensors for measuring field components extending parallel to the measuring plane, and that via correction circuits the measured values from field sensors unintentionally inclined relative to the measuring plane are corrected by means of the measured values obtained by the correction sensors.

Evidently, the method of the invention can be used analogously when measured values are present in the form of differences between field strengths detected at a distance from one another, for example by means of gradiometer devices. Field sensors are then arranged in a plurality of mutually parallel planes in order to measure field gradients.

Because of the large noise component in comparison with the actual useful signal, the sensor signals have a very high level. For better use of the dynamic range of subsequent amplifiers, notably A/D converters, it is particularly attractive to choose the measured values to be the differences between the values measured by means of the field sensors and by means of a coaxial level sensor, and to reduce the reference values also by the value of the correction function at the location of the level sensor. The differences on the output of the sensors should be formed by analog circuits, notably by superposing the output voltage of the level sensor on the output voltages of the measuring sensors.

The object of the invention is also achieved by means of a measuring device for determining the spatial field distribution and/or the spatial position of a useful field source producing the field distribution, which device consists of:

a multichannel field measuring device which comprises a plurality of spatially distributed sensors whereby measured values are produced which contain on the one hand useful measured values stemming from the useful field source and on the other hand noise measured values stemming from at least one noise field source, a correction circuit for forming correction values which are superposed on the measured values, so that compensated measured values are formed as the difference between the measured values and the values occurring at the areas of the associated field sensors because of a correction function, an arithmetic circuit for determining reference values produced by a fictitious reference field source by means of the field sensors, and for compensating these reference values in the same way as in the correction circuit, thus producing compensated reference values, a comparison circuit for comparing the compensated measured values with the compensated reference values, the reference field source thus being determined for which the pattern of compensated reference values corresponds best to the pattern of compensated measured values, the pattern of measured values being approximated by a correction function which contains a number of terms of a function series which are essential to the spatial variation of the noise measured values, in the correction function there being absent at least one term of the function series which is essential to the spatial variation of the useful measured values but not essential to the spatial variation of the noise-measured values.

These and other aspects of the invention will be apparent from and elucidated with reference to the embodiments described hereinafter.

DETAILED DESCRIPTION OF THE PREFERRED EMBODIMENTS

Figure 1:
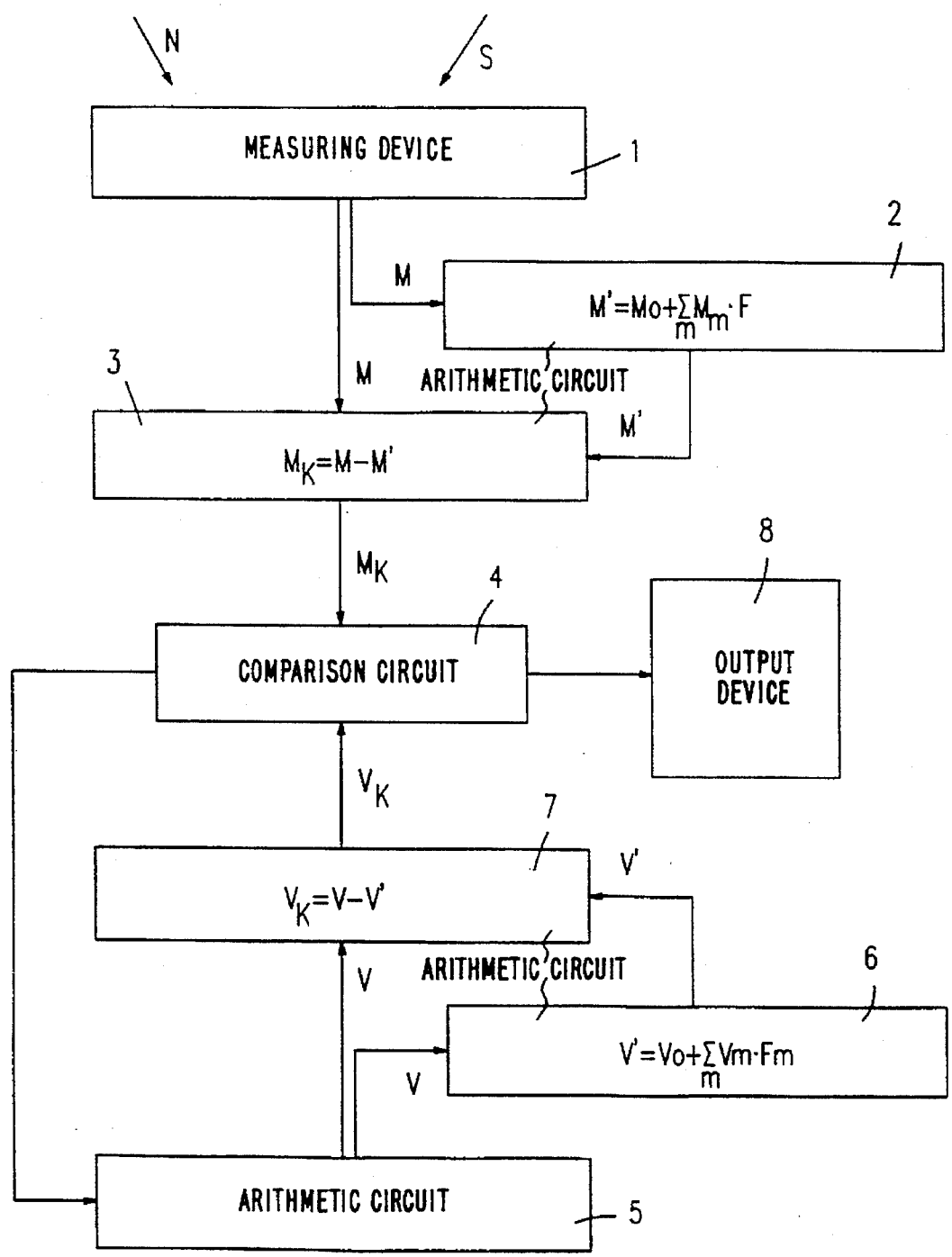
FIG. 1 shows a flow chart illustrating the method of the invention.

The overall execution of the method of the invention will be described in detail hereinafter with reference to FIG. 1.

The field distribution of a useful field N, on which a large noise field S is superposed, is to be measured in a two-dimensional or three-dimensional zone by means of a measuring device 1. The measuring device 1 is constructed, for example as described in Appl. Phys. Lett. 63, 1963, pp. 2700–2702 and comprises a plurality of sensors in the form of spatially distributed DC SQUID magnetometers and also comprises the necessary auxiliary devices such as amplifiers and the like.

Biomagnetic sources which are situated at a distance of from approximately 5 cm to 10 cm from the measuring device produce flux densities of approximately 100 fT at the areas of the sensors. Noise fields stem from noise sources which are much more remote and cause flux densities of approximately 100 pT.

The individual sensors supply individual measured values $M_i$, the totality of which is denoted by the letter M. This concerns a pattern of individual measured values determined in a two-dimensional or three-dimensional zone.

Because of the substantially different distances between on the one hand the useful field source and the measuring device and between the measuring device and the noise field source on the other hand, the spatial characteristics of the useful measured values and the noise-measured values significantly deviate. When the useful measured values and the noise measured values are adapted by way of a respective, same mathematical function series (notably a power series), it appears that for some terms the associated function coefficients are pronounced upon adaptation of the useful measured values, whereas for the adaptation of the noise measured values the corresponding coefficients of these terms can be practically ignored.

The measured values M are adapted by a correction function M' in which at least one term of the selected function series is absent, the coefficient of said term being of significance only for the detection of the useful measured values but insignificant for the detection of the noise measured values. M' is then obtained, using an arithmetic circuit 2, as the sum of a constant value $M_o$ and a sum of the products of selected function terms $F_m$ and the associated coefficients $M_m$.

An arithmetic circuit 3 forms compensated measured values $M_k$ as differences between the original measured values M and the values M' calculated from the correction function. The values $M_k$ are applied to a comparison circuit 4 whereby, the useful field distribution and/or the spatial position of the associated useful field source is calculated on the basis of the values $M_k$. To this end, the arithmetic circuit 5 calculates reference values V of various fictitious useful field sources, which reference values were measured in the respective sensors. The pattern of these fictitious reference values V is adapted, in the same way as the pattern of measured values M, by a correction function V' as the sum of a constant value $V_o$ and the sum of the product of the term $F_m$ chosen for the measured values M and the associated coefficients $V_m$ (arithmetic circuit 6). In the arithmetic circuit 7 compensated reference values $V_k$ are formed from the difference between the calculated reference values V and the transformed values V' calculated for the same measuring locations. The comparison circuit 4 compares the values Mk and Vk. In the case of deviations, the procedure is repeated, using new reference values V from another, fictitious useful field source, until optimum correspondence is obtained. Subsequently, the data of the optimum reference source can be applied to an output device 8 as the data of the useful field source.

The quantities mentioned with reference to FIG. 1 may be vectors or scalar components.

Figure 2:
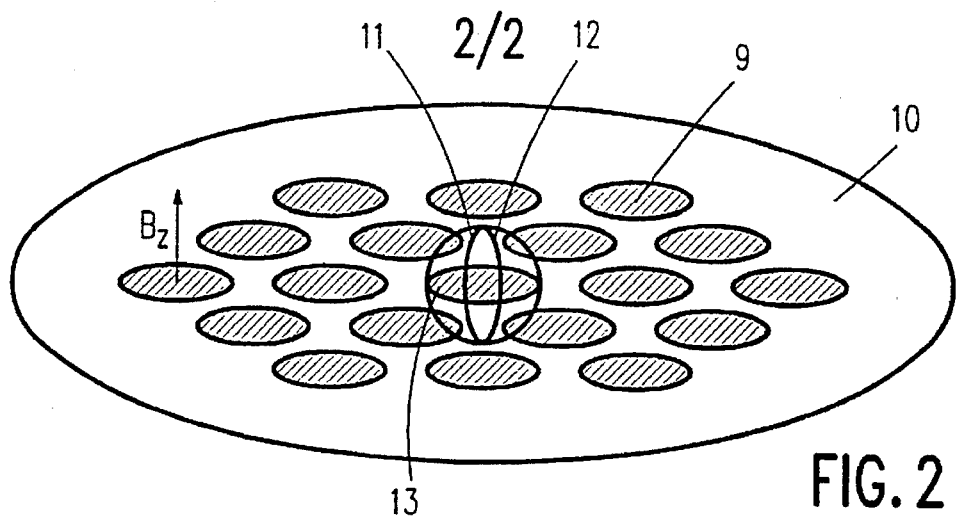
FIG. 2 shows diagrammatically an array of sensors arranged at the same angle in a measuring plane.

Referring to FIG. 2, 19 z-magnetometers 9 are coaxially arranged in a measuring plane 10. 19 different inductions Bz can thus be measured in the z direction, extending perpendicularly to the measuring plane 10. In addition, correction magnetometers 11 and 12 are arranged at the area of the central z magnetometer 13, said correction magnetometers enabling measurement of inductions Bx and By in the x direction and the y direction, respectively, parallel to the measuring plane.

The z magnetometers (numbering n+1=19) measure inductions Bi=Bo to Bn at the locations having the coordinates $x_i$ and $y_i$ in the measuring plane 10.

For the correction function, a Taylor power series terminated after the quadratic term was found to be suitable. Its expansion coefficients $G_k = G_0$ to $G_5$ can be calculated by way of the following set of equations:

$$B_0 = G_0 + G_1 x_0 + G_2 y_0 + G_3 x_0 y_0 + G_4 x_0 x_0 + G_5 y_0 y_0$$

$$B_1 = G_0 + G_1 x_1 + G_2 y_1 + G_3 x_1 y_1 + G_4 x_1 x_1 + G_5 y_1 y_1$$

$$\vdots$$

$$B_n = G_0 + G_1 x_n + G_2 y_n + G_3 x_n y_n + G_4 x_n x_n + G_5 y_n y_n$$

in vector notation this set of equations becomes:

$$\underline{B} = \underline{G} * \underline{\underline{X}}$$

where $$\underline{B} = (B_0 \ldots B_n)$$

$$\underline{G} = (G_0 \ldots G_5)$$

$$\underline{\underline{X}} = \begin{pmatrix} 1 \ldots 1 \\ x_0 \ldots x_n \\ y_0 \ldots y_n \\ x_0 y_0 \ldots x_n y_n \\ x_0^2 \ldots x_n^2 \\ y_0^2 \ldots y_n^2 \end{pmatrix}$$

The coefficients $G_k$ are determined by solution of the set of equations. For the method of the invention, n is preferably substantially larger than 6. The system is then redundant and the coefficients $G_k$ are determined which offer optimum adaptation the measured values $B_i$ (linear least squares fit). The larger the number of magnetometers, the less the intrinsic sensor noise will affect the result.

$$G = B * X^T (X * X^T)^{-1}$$

Subsequently, the noise signal calculated by means of this approximation at the location of the $i^{th}$ magnetometer is subtracted from the signal measured at the location i:

$$B^*_i = B_i - (G_0 + G_1 x_i + G_2 y_i + G_3 x_i y_i + G_4 x_i x_i + G_5 y_i y_i)$$

$$B = B - G * X$$

It is thus achieved that not only the mean magnetic field background and the mean gradient of the first order are subtracted, but also that a quadratic curvature of the magnetic field is compensated. Because of the spatial proximity of the sources to the magnetometers, the biomagnetic signal exhibits a strong curvature (terms of third and higher order) in the variation of the magnetic field which is extracted as the actual measured signal.

Figure 4:
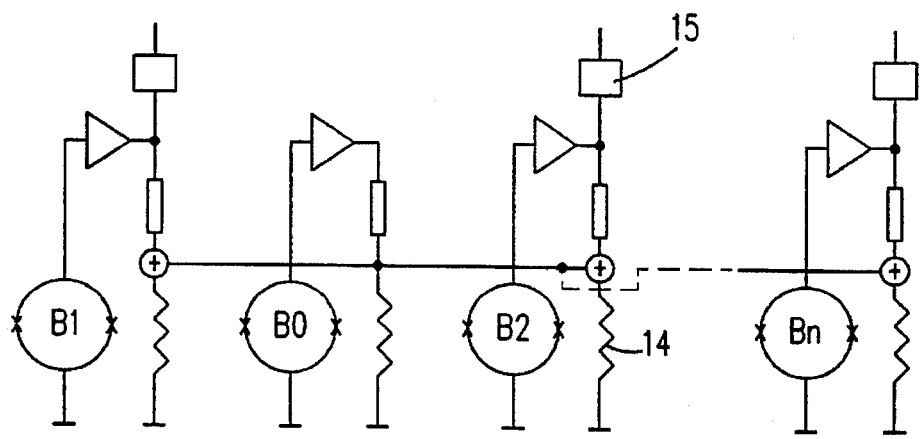
FIG. 4 shows a circuit diagram for the analog subtraction of the signal of a level sensor from the signals of the other sensors.

In order to ensure that the dynamic range of the electric circuits succeeding the magnetometers is not exceeded, the signal $B_o$ of the central z magnetometer 13 is subtracted from all other signals $B_1$ to $B_n$. This can be attractively performed by means of a small coupling-in coil connected to each other sensor (FIG. 4). These coils are usually present any way because they serve to drive the magnetometers as zero detectors in conjunction with a fed back control circuit. An analog subtraction circuit preceding each A/D converter 15 is also feasible. There may also be reasons for the signal of the central z-magnetometer to be generated as an overall external counter field by a large coil system, so that the same effect is obtained.

In order to compensate the inclination error of the magnetometers, this error is first measured exactly. This measurement can be by means of a system of Helmholtz coils whereby uniform field are applied successively in the x direction, the y direction and the z direction. The three measured signals in [V], divided by the magnetic field strength in (T), can be considered to be components of a normal vector of the magnetometer, the length of the vector indicating the sensitivity: $Q_{ix}$, $Q_{iy}$, $C_{iz}$, (Q denotes "transverse sensitivity"). The sensitivity of the x magnetometer and the y magnetometer in the x direction and the y direction is assumed to be $C_{ox}$ and $C_{oy}$, respectively.

The vector of the magnetic field in this location is measured by means of the central x, y and z magnetometers in the proposed device: $B_{ox} = S_{ox}/C_{ox}$, $B_{oy} = S_{oy}/C_{oy}$, $B_{oz} = S_{oz}/C_{oz}$. The signals of all other magnetometers $S_i[V]$ can then be corrected as follows (the analog subtraction of the signal from the central z-compensation magnetometer $S_{oz}/C_{oz}$ as described above was also taken into account) herein:

$$B_{irci} = S_i/C_{iz} - (S_{ox}/C_{ox}) * (Q_{ix}/C_{iz}) - (S_{oy}/C_{oy}) * (Q_{iy}/C_{iz}) - S_{oz}/C_{oz}$$

It is assumed herein that the noise field at the location of the individual magnetometers approximately equals the field at the location of the central three-axis magnetometer. This is, of course, a coarse approximation only. The coefficients $Q_{ix}$ and $Q_{iy}$, however, are only 1/100 of $C_{iz}$ when the device is accurately constructed, so that they represent only a correction quantity. Therefore, this approximation can be used in this case.

When a high-precesion construction with extremely small inclination errors of the z magnetometer is achieved, the correction by the x and y magnetometers can also be dispensed with.

If a more accurate correction of the inclination errors is required, more accurate correction functions for the x and y field components can be formed by means of a plurality of x and y magnetometers per measuring plane so as to represent their spatial variation more accurately.

Evidently, all manipulations performed on the measured signal must be taken into account in the reconstruction algorithm. This is comparatively simply possible; because an analytic solution of the inverse problem does not exist, always the "forward problem" is solved and the calculated field distribution is adapted to the measured field distribution. In the "forward problem", however, all corrections described above can be exactly implemented.

Figure 3:
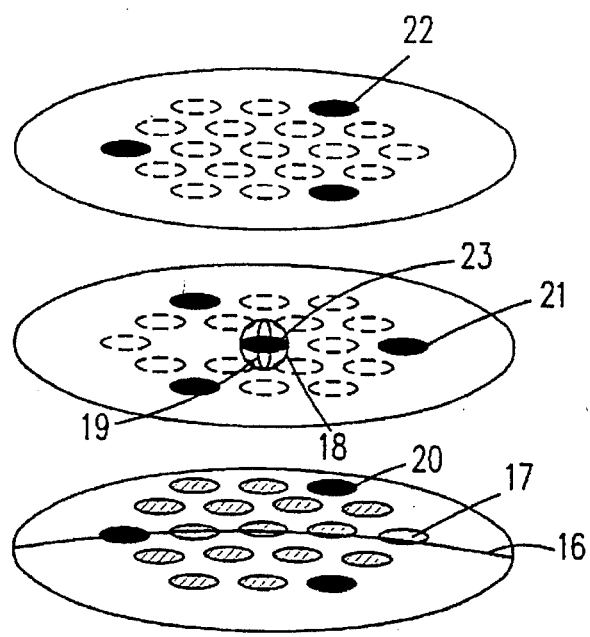
FIG. 3 shows sensors arranged in three mutually parallel planes.

In a preferred embodiment of the device as shown in FIG. 3 the derivative of the magnetic fields in the z direction is also taken into account. This is of importance if not all biomagnetometers are arranged in one plane. The line 16 in FIG. 3 is intended to indicate that the z magnetometers 17 are distributed across a curved surface.

A plurality of magnetometers are provided for the z direction, and a respective correction magnetometer 18, or 19 is provided for the x direction and the y direction, respectively. An arbitrary number of biomagnetometers 17 in the z-direction are enclosed by compensation magnetometers 20, 21 and 22 which are arranged in different planes which are situated at a distance from one another in the z-direction. These z-compensation magnetometers are arranged at the corners of three large isosceles triangles situated at a distance of each time from 50 mm to 100 mm. In each plane z- compensation gradiometers are arranged on an isosceles triangle. A tenth z-compensation magnetometer 23 is arranged, together with the x and y correction magnetometers, at the centre of the triangle in the central plane.

The set of equations for determining the coefficients of the transformed function is now:

$$B_0 = G_0 + G_1 x_0 + G_2 y_0 + G_3 z_0 + G_4 x_0 y_0 + G_5 x_0 z_0 + G_6 y_0 z_0 + G_7 x_0 x_0 + G_8 y_0 y_0 + G_9 z_0 z_0$$

$$B_1 = G_0 + G_1 x_1 + G_2 y_1 + G_3 z_1 + G_4 x_1 y_1 + G_5 x_1 z_1 + G_6 y_1 z_1 + G_7 x_1 x_1 + G_8 y_1 y_1 + G_9 z_1 z_1$$

.
.
.

$$B_9 = G_0 + G_1 x_9 + G_2 y_9 + G_3 z_9 + G_4 x_9 y_9 + G_5 x_9 z_9 + G_6 y_9 z_9 + G_7 x_9 x_9 + G_8 y_9 y_9 + G_9 z_9 z_9$$

or in the simpler vector notation:

$$\underline{B} = \underline{\underline{G}} * \underline{X}$$

where $$\underline{\underline{X}} = \begin{pmatrix} 1 \ldots 1 \\ x_0 \ldots x_9 \\ y_0 \ldots y_9 \\ z_0 \ldots z_9 \\ x_0 y_0 \ldots x_9 y_9 \\ x_0 z_0 \ldots x_9 z_9 \\ y_0 z_0 \ldots y_9 z_9 \\ x_0^2 \ldots x_9^2 \\ y_0^2 \ldots y_9^2 \\ z_0^2 \ldots z_9^2 \end{pmatrix}$$

This set of equations can be solved exactly. The individual measured values of the biomagnetometers are then corrected as follows:

$$B_i = B_i - (G_0 + G_1 x_i + G_2 y_i + G_3 z_i + G_4 x_i y_i + G_5 x_i z_i +$$
$$G_6 y_i z_i + G_7 x_i x_i + G_8 y_i y_i + G_9 z_i z_i)$$

The above correction of the inclination angle of the magnetometers by the magnetometers in the x-direction and the y-direction and the improved use of the dynamic range by analog subtraction of a central z-magnetometer signal could also take place.

For the described arrangement or for other feasible arrangements of magnetometers it is only important that the coefficient matrix X is not singular. Moreover, the information contained in this matrix should be substantially linearly independent so that the coefficients $G_i$ can be calculated in a stable fashion. This is case notably for the described arrangements.

In an environment which is less disturbed, the Taylor series can be terminated already after the linear term.

It is not very decisive whether the magnetometers used for calculating the correction coefficients themselves have a large biomagnetic signal or not. It is to be ensured that the correction does not lead to excessive loss of biomagnetic signal. As a measure in this respect use can be made of the mean signal amplitude of a current dipole (typical biomagnetic source):

$$Av = \sqrt{\frac{\Sigma B_i^2}{N}} \quad \text{prior to correction steps, and}$$

$$Am = \sqrt{\frac{\Sigma B_i^2}{N}} \quad \text{after correction steps } (N =$$

number of magnetometers).

The mean amplitude for near current dipoles should not drop to values smaller than approximately 10% after the noise field compensation. This is the case in the described devices.

An analogous comparison of the calculated amplitude of a disturbing magnetic dipole at a distance of a few meters before and after the compensation has revealed that a power series of up to the second order yields noise field suppression factors of $10^5$.

Other functions can also be used as polynomials for a series expansion. It is only important that the termination of the series expansion after one of the first terms leads to spatial high-pass filtering.

The correction of noise signals by a power series as described above can also be used for devices comprising conventional gradiometers.

The above correction formulas also apply when the output signals of the gradiometers are inserted for B. The transverse sensitivity of the gradiometers can be corrected accordingly, by means of x and y magnetometers.

Analogously to the described method, magnetic field components other than the z-component described above can also be determined. For example, in many locations each time three orthogonal magnetometers may be provided. In that case the z as well as the x and y components will be expanded in a power series. The measured values are again appropriately corrected by subtraction of the linear and/or quadratic term. The locations for the three-axis magnetometers must be situated so that none of the coefficient matrices is singular. Such arrangements are important for systems in which the biomagnetic signals are to be recorded around the entire head (helm system) or around the torso, the magnetometers being uniformly distributed around the head or the torso. When the x, y and z components of the magnetic field are treated completely independently, for the same noise field suppression factors, the number of magnetometers is tripled in comparison with the measurement in only one coordinate direction.

Three-dimensional systems of this kind can be further simplified by strictly taking into account the relations between the components of a flux density vector field which follow from the Maxwell equations.

When the correction function is formed up to the quadratic terms of a Taylor series, it can be demonstrated that 15 linearly independent equations can be indicated for the Taylor coefficients to be determined in the correction algorithm, so that the number of the magnetometers required to achieve for the same noise field suppression can be reduced by 15.

The linearly independent equations for the Taylor coefficients are obtained as folows.

Formulation for the Taylor expansion:

$$B_x(x,y,z) = A_0 + A_1 x + A_2 y + A_3 z + A_4 x^2 + A_5 y^2 + A_6 z^2 + A_7 xy + A_8 yz + A_9 xz$$

$$B_y(x,y,z) = B_0 + B_1 x + B_2 y + B_3 z + B_4 x^2 + B_5 y^2 + B_6 z^2 + B_7 xy + B_8 yz + B_9 xz$$

$$B_z(x,y,z) = C_0 + C_1 x + C_2 y + C_3 z + C_4 x^2 + C_5 y^2 + C_6 z^2 + C_7 xy + C_8 yz + C_9 xz$$

Calculation of the derivatives:

$$\frac{\partial B_x}{\partial x} = A_1 + 2A_4 x + A_7 y + A_9 z$$

$$\frac{\partial B_x}{\partial y} = A_2 + 2A_5 y + A_7 x + A_8 z$$

$$\frac{\partial B_x}{\partial z} = A_3 + 2A_6 z + A_8 y + A_9 x$$

Analogous equations hold for $B_y$ and $B_z$.
It follows from the Maxwell equation div B=0 that:

$$A_1 + 2A_4 x + A_7 y + A_9 z + B_2 + 2B_5 y + B_7 x + B_8 z + C_3 + 2C_6 z + C_8 y + C_9 x = 0$$
$$\forall x, y, z$$

The following linearly independent equations result therefrom:

$$A_1 + B_2 + C_3 = 0$$

$$2A_4 + B_7 + C_9 = 0$$

$$A_7 + 2B_5 + C_8 = 0$$

$$A_9 + B_8 + 2C_6 = 0$$

From the Maxwell equation rot B=0 (no currents flow outside the body!) it also follows that:

$$(B_3 + 2B_6 z + B_8 y + B_9 x) - (C_2 + 2C_5 y + C_7 x + C_8 z) = 0$$

$$(C_1 + 2C_4 x + C_7 y + C_9 z) - (A_3 + 2A_6 z + A_8 y + A_9 x) = 0$$

$$(A_2 + 2A_5 y + A_7 x + A_8 z) - (B_1 + 2B_4 x + B_7 y + B_9 z) = 0 \quad \forall x, y, z$$

Further linearly independent equations follow therefrom:

$$B_3 - C_2 = 0 \quad C_1 - A_3 = 0 \quad A_2 - B_1 = 0$$

$$B_9 - C_7 = 0 \quad 2C_4 - A_9 = 0 \quad A_7 - 2B_4 = 0$$

$$2B_6 - C_8 = 0 \quad C_9 - 2A_6 = 0 \quad A_8 - B_9 = 0$$

Of the three equations denoted by *, only two are linearly independent, so that the third is identically solved. All other equations are linearly independent, so that the number of linearly independent equations is 15.

If the measured magnetic field is to be expanded in a Taylor series up to the second order as described above, the following set of equations must be solved:

$$\underline{B} = \begin{pmatrix} a\,d\,e & f & (-l-p) & l & p & (2k) & (2l) & (2j) \\ b\,e\,g & h & k & (-k-n) & n & (2l) & (2m) & (2i) \\ c\,f\,h & (-d-g) & j & m & (-j-m) & (2i) & (2n) & (2p) \end{pmatrix} * \underline{X}$$

$$\underline{B} = \underline{\underline{U}} * \underline{X}$$

where $$\underline{B}(x,y,z) = (B_x(x,y,z), B_y(x,y,z), B_z(x,y,z))^T$$

$$\underline{X} = (1, x, y, z, x^2, y^2, z^2, xy, yz, xz)^T$$

For example, if $B_x$, $B_y$ and $B_z$ are measured in at least five suitable points, the coefficients a . . . p can be calculated. It is again advantageous to perform measurements in substantially more than five points and to determine the coefficients a . . . p which provide optimum adaptation of the measured values. To this end, use can be made of the following method:

$$\delta_2 = \sum_1 (B_1 - \underline{n}_i^T * \underline{\underline{U}} * \underline{X}_i)^2 \text{ where } \delta^2 = Min$$

$n_j$ are the normal vectors of the magnetometers:

$$n_j = (n_{xi}, n_{yi}, n_{zi})^T \text{ and } X_i = (1, x_i, y_i, z_i, x_i^2 \ldots)^T$$

The derivatives $$\frac{\partial \delta_2}{\partial a} = 01, \frac{\partial \delta_2}{\partial b} = 0, \ldots$$

then provide the desired coefficients a ... p of the matrix U. All measured values can then be corrected as follows:

$$B_i^{corr} = B_i^{ori} - U * X_i$$

Another attractive embodiment (for example, for the so-called "helm system") comprises measuring sensors which are uniformly distributed across a strongly curved surface and which determine the components of the magnetic field perpendicularly to the surface. It is to be noted that the measuring sensors provide measured values which contain contributions from the field components in the x and/or y and/or z direction. This necessitates more work calculation and complicates the set of equations for determining the function coefficients.

We claim:

1. A method of determining the spatial field distribution and/or the spatial position of a useful field source producing the field distribution by means of a multi-channel field measuring device which comprises a plurality of spatially distributed sensors which generate measured values which contain on the one hand useful measured values stemming from the useful field source and on the other hand noise measured values stemming from at least one noise field source, correction values being formed and superposed on the measured values so that compensated measured values are obtained which are compared with similarly compensated, mathematically derived reference values which are produced by a fictitious reference field source by means of the field sensors, the method thus determining the reference field source for which the pattern of compensated reference values corresponds best to the pattern of compensated measured values, characterized in that the pattern of measured values is approximated by a correction function which contains a number of terms of a function series which are essential to the spatial variation of the noise measured values, in the correction function there being absent at least one term of the function series which is essential to the spatial variation of the useful measured values but not essential to the spatial variation of the noise measured values, that compensated measured values are formed as the difference between the measured values and the values occurring at the areas of the associated field sensors on the basis of the correction function, and that the reference values are transformed into compensated reference values in the same way.

2. A method as claimed in claim 1, characterized in that polynomials of a Taylor series or Tschebyscheff polynomials or trigonometric functions or spherical functions are formed as the function series.

3. A method as claimed in claim 2, characterized in that the field sensors are arranged in a single measuring plane, so that field components extending perpendicularly to the measuring plane are determined.

4. A method as claimed in claim 2, characterized in that three groups of field sensors are arranged in three orthogonal measuring planes.

5. A method as claimed in claim 4, characterized in that the secondary conditions arising from the Maxwell equations (div B=0, rot B=0) are taken into account for determining the correction function.

6. A method as claimed in claim 4, characterized in that with the field sensors arranged in one measuring plane there are associated correction sensors for measuring field components extending parallel to the measuring plane, and that correction circuits correct the measured values from field sensors which are unintentionally inclined relative to the measuring plane by means of the measured values obtained by means of the correction sensors.

7. A method as claimed in claim 1, characterized in that the field sensors are arranged in a single measuring plane, so that field components extending perpendicularly to the measuring plane are determined.

8. A method as claimed in claim 7, characterized in that with the field sensors arranged in one measuring plane there are associated correction sensors for measuring field components extending parallel to the measuring plane, and that correction circuits correct the measured values from field sensors which are unintentionally inclined relative to the measuring plane by means of the measured values obtained by means of the correction sensors.

9. A method as claimed in claim 1, characterized in that three groups of field sensors are arranged in three orthogonal measuring planes.

10. A method as claimed in claim 9, characterized in that the secondary conditions arising from the Maxwell equations (div B=0, rot B=0) are taken into account for determining the correction function.

11. A method as claimed in claim 10, characterized in that with the field sensors arranged in one measuring plane there are associated correction sensors for measuring field components extending parallel to the measuring plane, and that correction circuits correct the measured values from field sensors which are unintentionally inclined relative to the measuring plane by means of the measured values obtained by means of the correction sensors.

12. A method as claimed in claim 9, characterized in that with the field sensors arranged in one measuring plane there are associated correction sensors for measuring field components extending parallel to the measuring plane, and that correction circuits correct the measured values from field sensors which are unintentionally inclined relative to the measuring plane by means of the measured values obtained by means of the correction sensors.

13. A method as claimed in claim 1, characterized in that the measured values are chosen as the differences between the values measured by means of the field sensors and those measured by means of a coaxial level sensor, and that the reference values are also reduced by the value of the correction function at the area of the level sensor.

14. A method as claimed in claim 13, characterized in that the differences on the output of the sensors are formed by analog circuits.

15. A method as claimed in claim 1, characterized in that the sensors are uniformly distributed across a strongly curved measuring plane.

16. A measuring device for determining the spatial field distribution and/or the spatial position of a useful field source producing the field distribution, which device consists of:

a multichannel field measuring device which comprises a plurality of spatially distributed sensors whereby measured values are produced which contain on the one hand useful measured values stemming from the useful field source and on the other hand noise-measured values stemming from at least one noise field source, a correction circuit for forming correction values which are superposed on the measured values so that compensated measured values are formed as the difference between the measured values and the values occurring at the areas of the associated field sensors because of a correction function, an arithmetic circuit for determining reference values which are produced by a fictitious reference field source by means of the field sensors, and for compensating these reference values in the same way as in the correction circuit, thus producing compensated reference values, a comparison circuit for comparing the compensated measured values with the compensated reference values, the reference field source thus being determined for which the pattern of compensated reference values corresponds best to the pattern of compensated measured values, the pattern of measured values being approximated by a correction function which contains a number of terms of a function series which are essential to the spatial variation of the noise measured values, in the correction function there being absent at least one term of the function series which is essential to the spatial variation of the useful measured values but not essential to the spatial variation of the noise measured values.

17. A measuring device as claimed in claim 16, characterized in that the field sensors are arranged in a single measuring plane so that field components extending perpendicularly to the measuring plane are determined.

18. A measuring device as claimed in claim 16, characterized in that three groups of field sensors are arranged in three orthogonal measuring planes.

19. A measuring device as claimed in claim 16, characterized in that analog circuits for forming differences are connected to the output of the sensors.

20. A measuring device as claimed in claim 16, characterized in that the sensors are uniformly distributed across a strongly curved measuring plane.

* * * * *